United States Patent
Nguyen et al.

(10) Patent No.: US 7,631,231 B2
(45) Date of Patent: Dec. 8, 2009

(54) METHOD AND APPARATUS FOR TESTING THE CONNECTIVITY OF A FLASH MEMORY CHIP

(75) Inventors: Sang Thanh Nguyen, Union City, CA (US); Hieu Van Tran, San Jose, CA (US); Hung O. Nguyen, Fremont, CA (US); Phil Klotzkin, Springfield, NJ (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 531 days.

(21) Appl. No.: 11/407,602

(22) Filed: Apr. 19, 2006

(65) Prior Publication Data

US 2007/0250744 A1 Oct. 25, 2007

(51) Int. Cl.
G11C 29/00 (2006.01)
G01R 31/28 (2006.01)
G11C 7/00 (2006.01)
(52) U.S. Cl. .................... 714/718; 714/734; 365/201
(58) Field of Classification Search ................ 714/718, 714/719, 724, 735, 734; 365/201
See application file for complete search history.

(56) References Cited

U.S. PATENT DOCUMENTS

| | | | | |
|---|---|---|---|---|
| 5,045,488 A | * | 9/1991 | Yeh | 438/257 |
| 5,377,199 A | * | 12/1994 | Fandrich | 714/726 |
| 5,819,025 A | * | 10/1998 | Williams | 714/30 |
| 6,282,145 B1 | * | 8/2001 | Tran et al. | 365/230.06 |
| 6,975,539 B2 | * | 12/2005 | Tran | 365/185.2 |
| 7,360,116 B2 | * | 4/2008 | Nakamura | 714/30 |
| 2002/0010877 A1 | * | 1/2002 | Ernst et al. | 714/25 |
| 2003/0191998 A1 | * | 10/2003 | Nakamura | 714/733 |
| 2007/0022333 A1 | * | 1/2007 | Terry | 714/718 |

OTHER PUBLICATIONS

"Memory system connectivity exploration" by Grun et al. Design, Automation and Test in Europe Conference and Exhibition, 2002. Proceedings Publication Date: 2002 On pp. 894-901 ISBN: 0-7695-1471-5.*

* cited by examiner

Primary Examiner—Cynthia Britt
(74) Attorney, Agent, or Firm—DLA Piper LLP (US)

(57) ABSTRACT

In one embodiment of the invention, circuitry and hardware for connectivity testing are fabricated on an IC, and in particular an IC containing a flash memory array. This testing circuitry is electrically connected to the bond pads of the IC. In some embodiments, the testing circuitry includes a boundary scan cell connected to each bond pad, allowing for rapid connectivity testing of flash memory chips in accordance with testing standards such as the JTAG standard. The invention further includes methods in which the pins and/or memory cells of a flash memory chip are sequentially sent a series of data so as to test the connectivity of portions of the IC. The sequentially-sent data is then retrieved and compared to the original data. Discrepancies between these sets of data thus highlight connectivity problems in the IC.

18 Claims, 9 Drawing Sheets

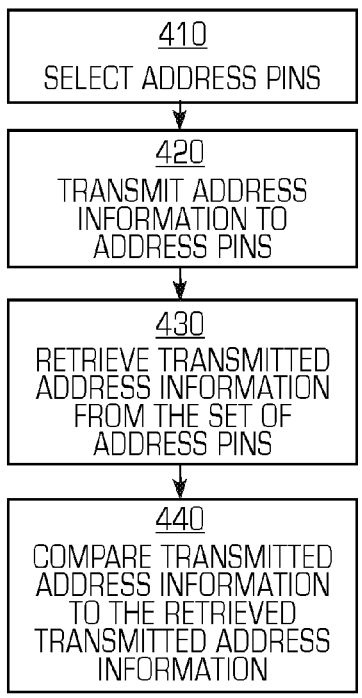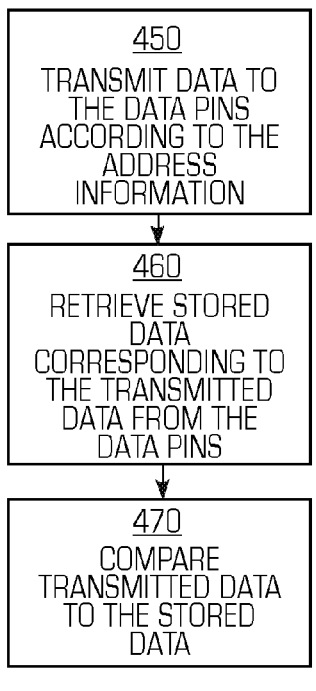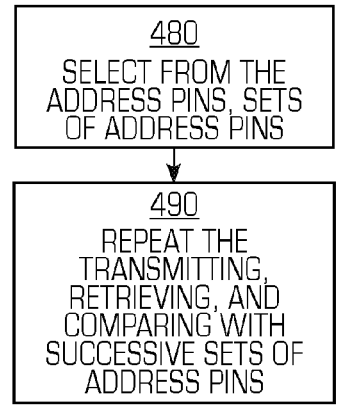
FIG. 4A    FIG. 4B    FIG. 4C
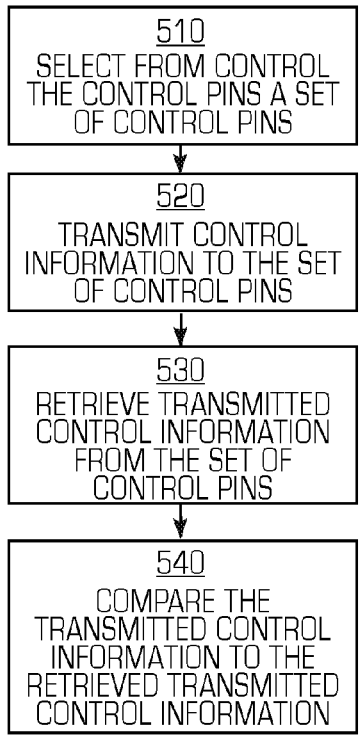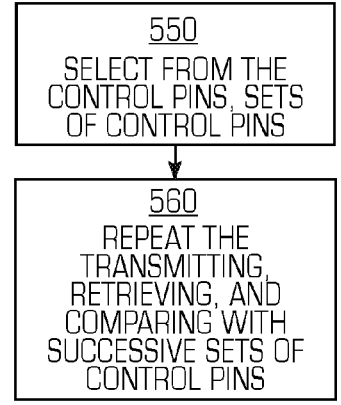
FIG. 5A    FIG. 5B

METHOD AND APPARATUS FOR TESTING THE CONNECTIVITY OF A FLASH MEMORY CHIP

BRIEF DESCRIPTION OF THE INVENTION

This invention relates generally to integrated circuit (IC) testing. More specifically, this invention relates to a method and apparatus for testing the connectivity of a flash memory chip.

BACKGROUND OF THE INVENTION

Wafer bond testing of semiconductor ICs is an increasingly important process. As circuit density increases and ICs become more complex, the potential for process variations and mistakes to occur increases. In particular, larger and more complex chips often have greater numbers of bond wires, leading to a greater risk of process problems in the wire bonding process. For example, FIG. 1 illustrates a typical IC 100 with dice 102, 103 stacked on a substrate 104 having bond pads 106, 108, 110, 112. The bond pads 106, 108, 110, 112 provide electrical connectivity between the IC 100 and the chip's pins (not shown), while bond wires 120-126 connect the die 102 to the bond pads 106-112 and bond wire 132 connects the die 103 to the bond pad 112. For the sake of clarity, other wire bonds are not shown. Typically, the bond wiring process results in each bond wire 120-126 being connected to a single bond pad 106-112. However, process mistakes can result in errors such as "opens," where one bond wire 120-126 is not connected to its corresponding bond pad 106-112, e.g. bond wire 120, and "shorts" such as the one shown, where two or more bond wires 122-124 contact each other or are connected to the same bond pad 108, effectively shorting them out. Such errors result in incorrect data transfer to the die 102 and an IC that fails to function properly.

IC testing, such as wafer bond connectivity testing, is designed to detect such errors. However, current IC testing is not without its drawbacks. Greater circuit densities yield ICs with ever greater numbers of bond wires 120-126. Accordingly, many tests that check the connectivity of every single bond wire have become overly time-consuming and cost-ineffective. Conversely, tests that save time often sacrifice coverage to do so, or result in test data that can be difficult to analyze.

It is therefore desirable to improve the connectivity testing of ICs.

SUMMARY OF THE INVENTION

The invention can be implemented in numerous ways, including as a method and an apparatus. Several embodiments of the invention are discussed below.

In one embodiment of the invention, a method of testing a flash memory integrated circuit having a flash memory array, address pins for specifying addresses of the flash memory array, and data pins for transferring data to be stored at the addresses of the flash memory array, comprises selecting from the address pins a set of address pins, and transmitting address information to the set of address pins. The transmitted address information is retrieved from the set of address pins. The transmitted address information is compared to the retrieved transmitted address information, so as to determine an electrical connectivity between the set of address pins and the flash memory array.

In another embodiment of the invention, a method of testing a flash memory integrated circuit having a flash memory array and control pins for receiving control signals comprises selecting from the control pins a set of control pins, and transmitting control information to the set of control pins. The transmitted control information is retrieved from the set of control pins, and the transmitted control information is compared to the retrieved transmitted control information, so as to determine an electrical connectivity between the set of control pins and the flash memory array.

In another embodiment of the invention, a device for testing a flash memory integrated circuit having a flash memory array, address pins for specifying addresses of the flash memory array, and data pins for transferring data to be stored at the addresses of the flash memory array, comprises a controller and an interface configured to place the controller in electronic communication with the address pins and the data pins of the flash memory circuit. The controller is configured to select a set of the address pins, to transmit address information to the selected set of address pins, to retrieve the transmitted address information from the set of address pins, and to compare the transmitted address information to the retrieved transmitted address information, so as to determine an electrical connectivity between the set of address pins and the flash memory array.

In another embodiment of the invention, an integrated circuit comprises a substrate, and a flash memory array fabricated on the substrate. A plurality of bond pads are fabricated on the substrate. Also, a plurality of boundary scan cells fabricated on the substrate each in electronic communication with an associated one of the bond pads, wherein each boundary scan cell of the plurality of boundary scan cells is configured to transmit test data to the associated bond pad so as to test an electrical connection between the associated bond pad and the flash memory array.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention, together with further objects and advantages thereof, may best be understood by reference to the following description taken in conjunction with the accompanying drawings in which:

FIG. 4A Illustrates a test method consistent with aspects of the innovations herein.

FIG. 4B Illustrates a test method consistent with aspects of the innovations herein.

FIG. 4C Illustrates a test method consistent with aspects of the innovations herein.

FIG. 5A Illustrates a test method consistent with aspects of the innovations herein.

FIG. 5b Illustrates a test method consistent with aspects of the innovations herein.

Like reference numerals refer to corresponding parts throughout the drawings. Also, it is understood that the depictions in the figures are diagrammatic and not necessarily to scale.

DETAILED DESCRIPTION OF EMBODIMENTS OF THE INVENTION

In one embodiment of the invention, specialized circuitry and hardware for connectivity testing are fabricated on the IC. This testing circuitry is electrically connected to the bond pads of the IC. In this manner, a packaged IC can be quickly tested by simply passing the appropriate test signals to its pins. In some embodiments, the testing circuitry includes a BSC connected to each bond pad, allowing for rapid connectivity testing of flash memory chips in accordance with testing standards such as the Joint Test Action Group (JTAG) standard.

The BSCs are configured to help test the connectivity of a flash memory chip. Thus, the invention further includes methods in which the address pins of a flash memory chip are sequentially sent a series of addresses. The sequentially-sent addresses are then retrieved from the IC and compared to the original set of addresses. Discrepancies between these sets of addresses thus highlight connectivity problems in the IC. Other embodiments of the invention include the transmission of sets of test data to other pins such as data pins and control pins.

A flash memory chip typically contains address pins, data pins, and control pins. Address pins (such as those commonly labeled A0-AN) are used to access a plurality of memory cells. Data pins (also called IO pins or DQ pins) are used to read out data (such as 8 or 16 digital bits) from a memory chip or input data to be written into a memory chip. Control pins (such as those commonly labeled write-enable WE#, chip-enable CE#, output-enable OE#, system reset RST#, write-protect WP#, etc.) are used to control the operation of the chip such as reading data, writing data, erasing data, protecting non-volatile data, system reset, standby or sleep mode, etc. A flash memory chip contains a flash memory array that consists of a plurality of flash memory cells. Flash memory refers to a memory that is non-volatile such as NOR flash (fast random access, with access times typically measured in tens of nanoseconds), NAND flash (slow random access, with access times typically in the tens of microseconds), MRAM (Magnetic Random Access Memory), PCRAM (phase change RAM), etc. One application of the invention is to NOR flash memory, and in particular to source side injection (SSI) split gate NOR flash memory, which is a type of NOR flash memory that is very efficient in programming and erasing operations. This memory is described in U.S. Pat. No. 5,045,488 to Yeh and its array method, apparatus and program/erase/read operation are described in U.S. Pat. No. 6,282,145 and in U.S. Pat. No. 6,975,539 to Tran et al., each of which are hereby incorporated by reference in their entireties and for all purposes. A single level or multilevel storage per cell can be used in this SSI split gate flash memory cell.

Figure 1:
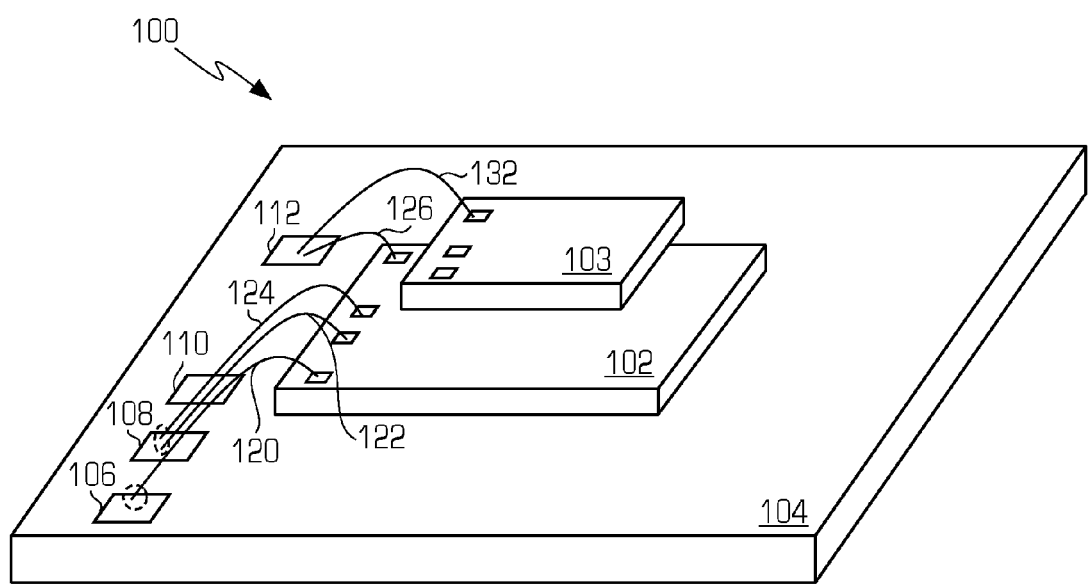
FIG. 1 illustrates a conventional IC displaying potential errors resulting from the wire bonding process.
Figure 2A:
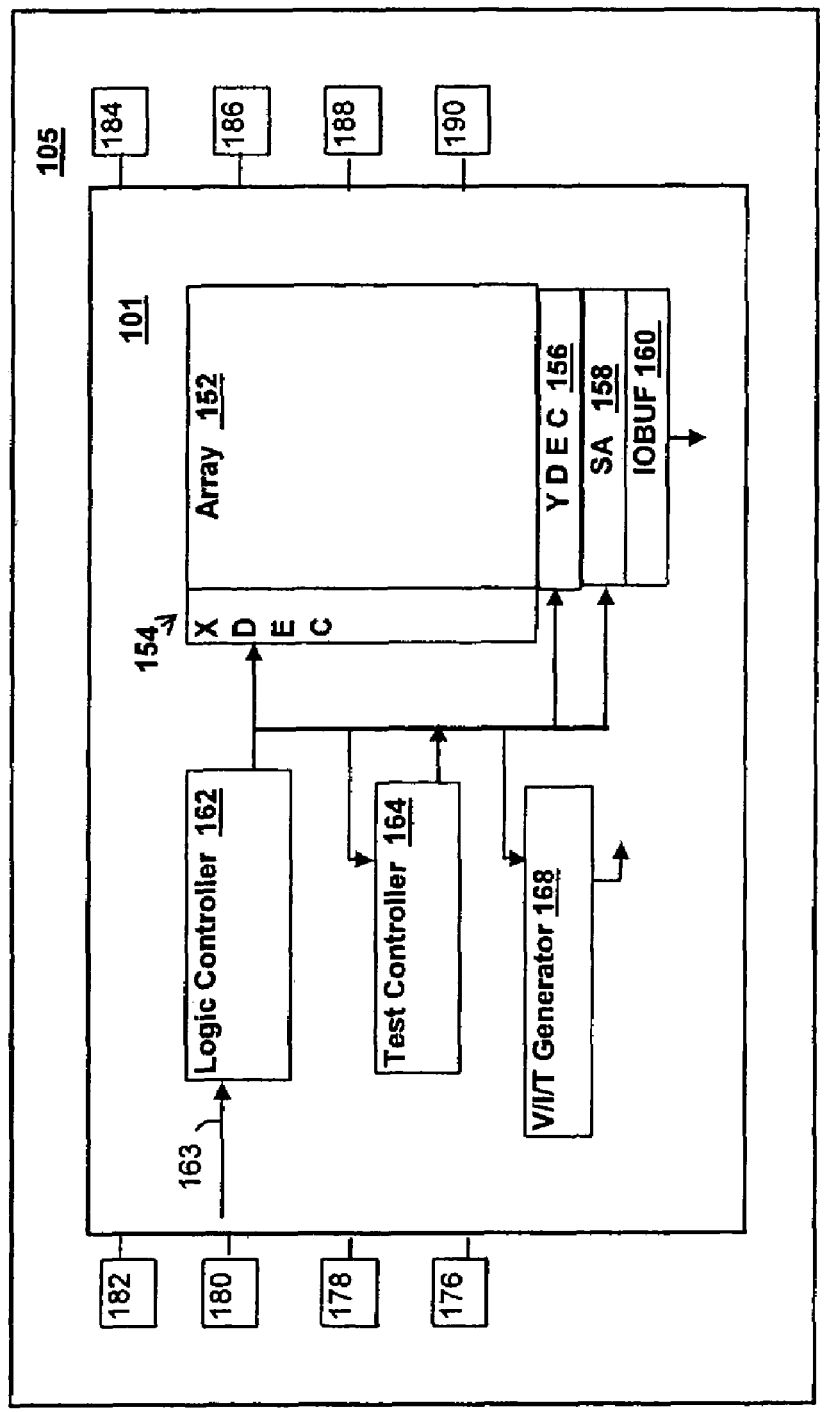
FIG. 2A illustrates a flash memory system configured for connectivity testing according to embodiments of the present invention.

FIG. 2A is a block diagram illustrating a flash memory array 105. The flash memory can be a digital single level or multilevel memory array system. The flash memory array 105 includes a flash memory system 101 and a plurality of address, control, and IO pads 176-190 (8 pads are shown as exemplary). Power pads (i.e., VDD, GND) are not shown. The flash memory array system 101 includes a memory array 152 with a plurality of memory cells (not shown) and a reference array (not shown) that includes a plurality of reference memory cells (not shown). An N bit digital multilevel cell is defined as a memory cell capable of storing $2^N$ voltage levels. The reference array is used as a reference system of reference voltage levels to verify the contents of the memory array 152. In another embodiment, the memory array 152 may include reference memory cells for storing the reference voltage levels.

In one embodiment, the memory array 152 includes source side injection flash technology, which uses lower power in hot electron programming, and efficient injector based Fowler-Nordheim tunneling erasure. Programming operations may be performed by applying a high voltage on the source of the memory cell, a bias voltage on the control gate of the memory cell, and a bias current on the drain of the memory cell. Programming in effect places electrons on the floating gate of the memory cell. Erase operations are performed by applying a high voltage on the control gate of the memory cell and a low voltage on the source and/or drain of the memory cell. The erase in effect removes electrons from the floating gate of the memory cell. A verify operation (sensing or reading) is performed by placing the memory cell in a sense voltage mode, e.g., a bias voltage on the source, a bias voltage on the gate, and a bias current coupled from the drain (bitline) to a low bias voltage such as ground. The voltage on the drain is the readout cell voltage VCELL. The bias current may be independent of the data stored in the memory cell. In another embodiment, verify operations (sensing or reading) are performed by placing the memory cell in a sense current mode, e.g., a low voltage on the source, a bias voltage on the gate, and a load (resistor or transistor) coupled to the drain (bitline) from a high voltage supply. The voltage on the load is the readout voltage.

Embodiments illustrating the architecture of such arrays and their operation are disclosed in U.S. Pat. No. 6,282,145 to Tran et al., which is hereby incorporated by reference in its entirety and for all purposes. One of ordinary skill in the art will realize that the single or multilevel memory cells of the memory array 152 may be arranged in various ways, such as in rows and columns or in segments. Likewise, various addressing schemes may be used which organize the memory cells into bytes, pages or other arrangements.

The flash digital memory array system 101 further includes an x decoder 154, a y decoder 156, a sense amplifier circuit 158, and an intelligent input/output interface 160. The y decoder 156 controls bitlines (not shown) coupled to columns in memory cells and the reference voltage cells, during write, read (or verify), and erase operations. The sense amplifier 158 senses the read data which is provided to the I/O interface 160. The I/O interface 160 also buffers input into the memory array system 101. The sense amplifier 158 also senses the read data and verifies the read data against input data during memory programming or erasing.

The flash digital memory system 101 further includes a logic controller 162, a test controller 164 and a bias VIT generator 168. The logic controller 162 controls the interface to an external controller and internal chip operation. The test controller 164 controls various test functions such as for testing of the memory array, chip functions, bias generators, etc. The VIT generators provides voltage, current, and timing references.

In response to an address signal and other control signals 163, a logic controller 162 decodes the signal 163 to control page, byte, segment or other addressing for the x decoder 154 and the y decoder 156. The x decoder 154 selects a row or a block of rows in the arrays 152 based on the signals from the address controller and provides precise multilevel bias values over temperature, process, and power supply used for consistent single level or multilevel memory operation for the memory array 152.

The system 105 also includes known power related circuits (not shown), such as band gap voltage generators, charge pumps, voltage regulators, and power management systems, and other control circuits (not shown) such as voltage algorithm controllers.

The system 105 may execute various operations on the memory array 152. An erase operation may erase all selected multilevel cells by removing the charge on selected memory cells according to the operating requirements of the non-volatile memory technology used. A data load operation may load a plurality of bytes of data to be programmed into the memory cells, e.g., 0 to 512 bytes in a page. A read operation may read out in parallel a plurality of bytes of data if the data (digital bits), e.g., 512 bytes within a page, is stored in the multilevel cells. A program operation may be done to store in parallel a plurality of bytes of data in (digital bits) into the multilevel cells by placing an appropriate charge on selected multilevel cells depending on the operating requirements of the non-volatile memory technology used. The operations on the memory may be, for example, the operations described in U.S. Pat. No. 6,282,145, incorporated herein by reference above.

write cycle starts with CE# low (chip enabled) and WE# low (writing enabled), but OE# high (output disabled). As above, address=XXH and data DQ<15:0>=XX00H select the first group for testing, which in this embodiment includes pins A<5:0>, WP#, and RST#. The read cycle follows immediately with CE# low, WE# high, and OE# low indicating that DQ<7:0> contains the test data pattern for A<5:0>,WP#, RST#. DQ<15:8> in this embodiment is inverted data of DQ<7:0>. This process is repeated for connectivity testing of the $2^{nd}$ pin group (DQ<7:0>=A<13:6>) and $3^{rd}$ pin group (DQ<7:0>=A<21:14>).

Figure 2B:
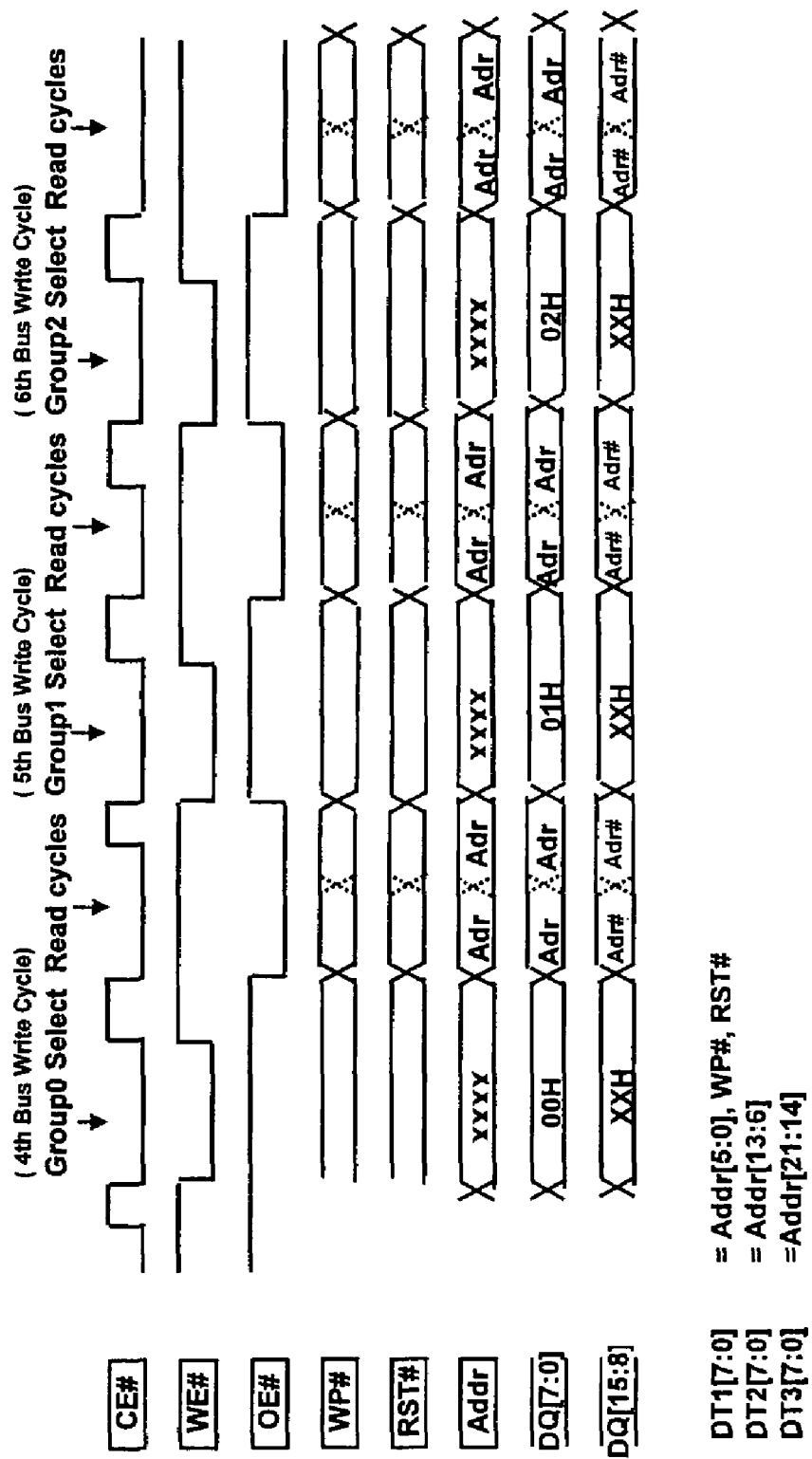
FIG. 2B illustrates a connectivity command sequence for use with the system of FIG. 2A.
Figure 2C:
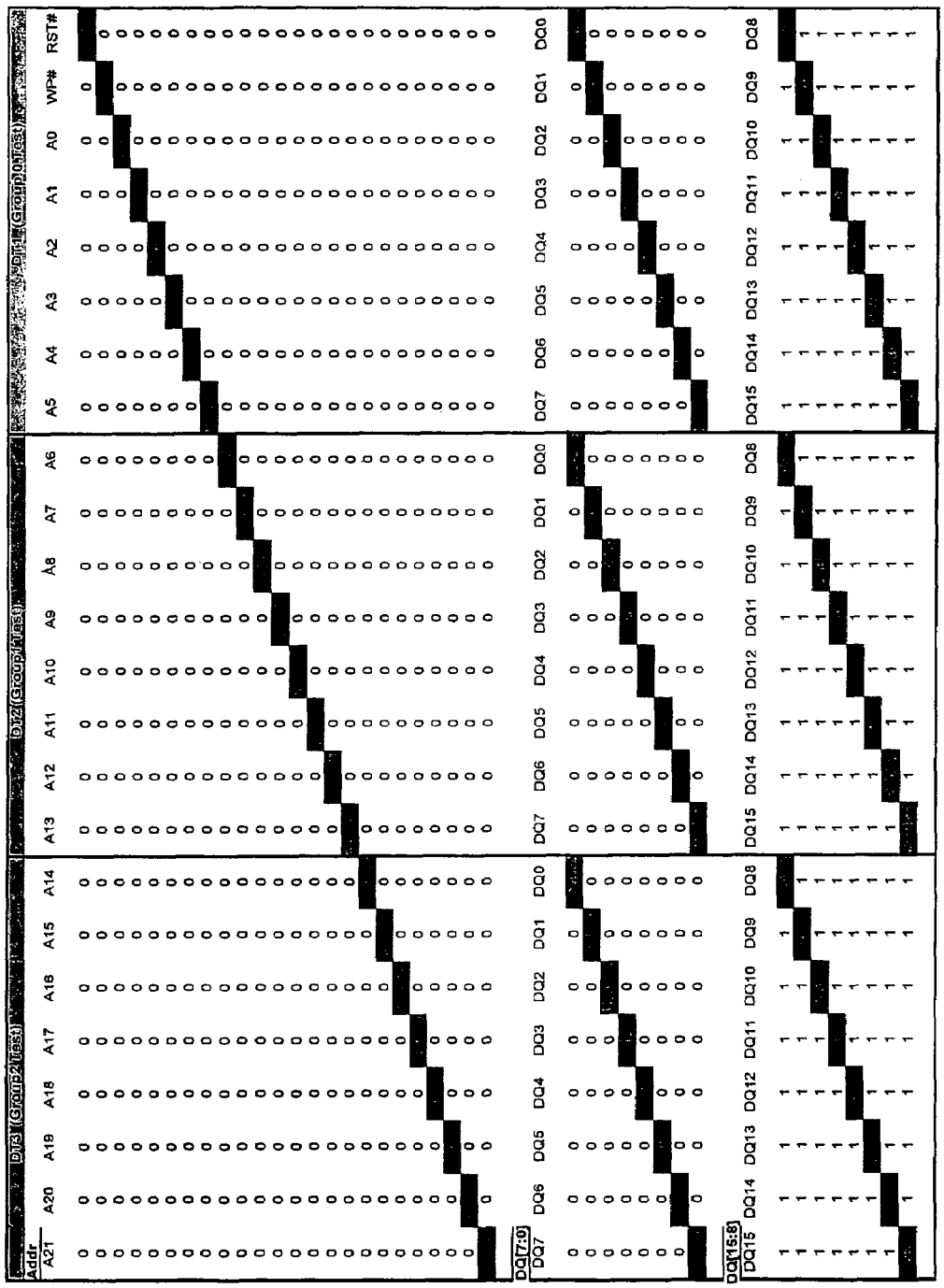
FIG. 2C illustrates an embodiment of an input data pattern for connectivity testing.

FIG. 2C shows an embodiment of test data patterns DQ<7:0>, DQ<15:8> for use in connectivity testing. Here, a walking '1' pattern of test data (i.e., a binary 1, with every other input data being binary 0) is sent to DQ<7:0>, DQ<15:8>, walking from left to right to cover all pins. As will be described further below, this walking 1 pattern will detect any open or short of any pins.

Figure 2D:
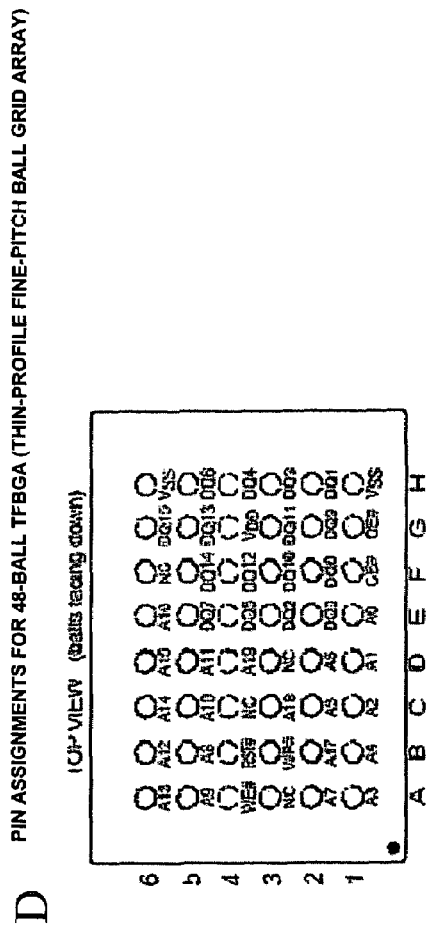
FIGS. 2D and 2E illustrate pin assignment and bonding diagrams, respectively, of the memory system of FIG. 2, schematically illustrating bond pads and associated signals for use in testing according to embodiments of the present invention.
Figure 2E:
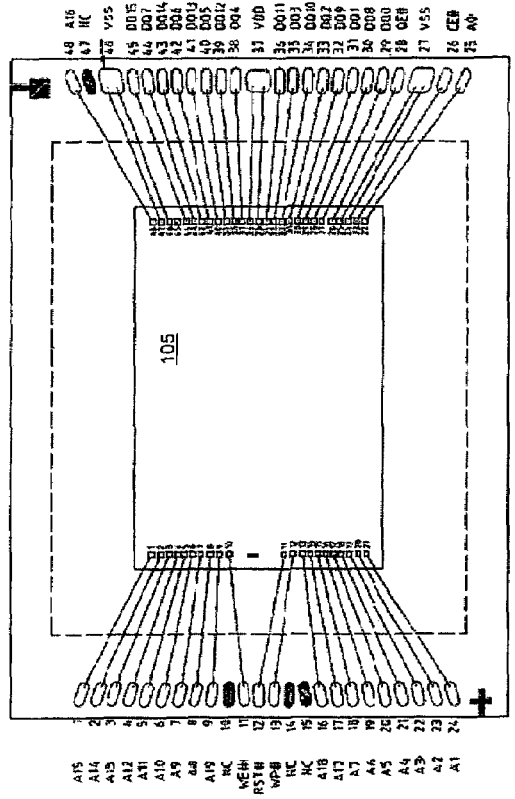

One of ordinary skill in the art will realize that embodiments of the invention can be employed to test connectivity in any chip package format. That is, it should be recognized that the flash system 105 can be packaged in many different formats, each of which can be tested according to the invention. For example, FIG. 2D illustrates a top view of a pin assignment for a 48 ball TFBGA (Thin-profile Fine-pitch Ball Array) for flash system 105. Similarly, FIG. 2E shows bonding for a 48 ball TFBGA for flash system 105. One of skill will

TABLE 1

Command Connectivity Sequence

| Command Sequence | 1st Bus Write Cycle | | 2nd Bus Write Cycle | | 3rd Bus Write Cycle | | 4th Bus Write Cycle | | Read Cycles | | 5th Bus Write Cycle | | Read Cycles | | 6th Bus Write Cycle | | Read Cycles | |
|---|---|---|---|---|---|---|---|---|---|---|---|---|---|---|---|---|---|---|
| | Addr | Data | Addr | Data | Addr | Data | Addr | Data | Addr | Data | Addr | Data | Addr | Data | Addr | Data | Addr | Data |
| Pin Connectivity | 5555H | AAH | 2AAAH | 55H | 5555H | 92H | XXH | 00H | Adr in | Adr or Adr# | XXH | 01H | Adr in | Adr or Adr# | XXH | 02H | Adr in | Adr or Adr# |
| Connectivity Exit | XXXXH | F0H | | | | | | | | | | | | | | | | |

An embodiment for testing a connectivity of chip 105 is shown in Table 1 and FIG. 2B-2D. In this embodiment, commands are first sent to initiate connectivity test mode. Once in this mode, commands are sent to select groups of pins for testing, and patterns of test data are then sent to these pin groups to test them. Table 1 shows a connectivity command sequence for flash system 105. It includes a pin connectivity command and a connectivity exit command. The pin connectivity command first includes signals that trigger a special mode by which connectivity is tested. In this embodiment, the first three bus write cycles perform this function, with address information and data, in hex format, (ADDR,DATA) equal to (5555H,AAH), (2AAAH,55H), (5555H,92H) that initiate connectivity operation mode. The $4^{th}$ bus write cycle then chooses the groups of pins to be tested: (ADDR,DATA)=(XXH,00H-02H). The hex number 00H represents the $1^{st}$ group, while 01H represents the $2^{nd}$ group, and 02H represents the $3^{rd}$ group. The cycle(s) following the $4^{th}$ write cycle are read cycles for cycling though various test patterns as explained in FIG. 2B.

FIG. 2B illustrates a timing sequence for signals associated with the read cycles subsequent to the $4^{th}$ write cycle. The $4^{th}$ realize that the invention can be employed to test the flash system 105 whether it is packaged according to FIG. 2D, FIG. 2E, or others.

Figure 3A:
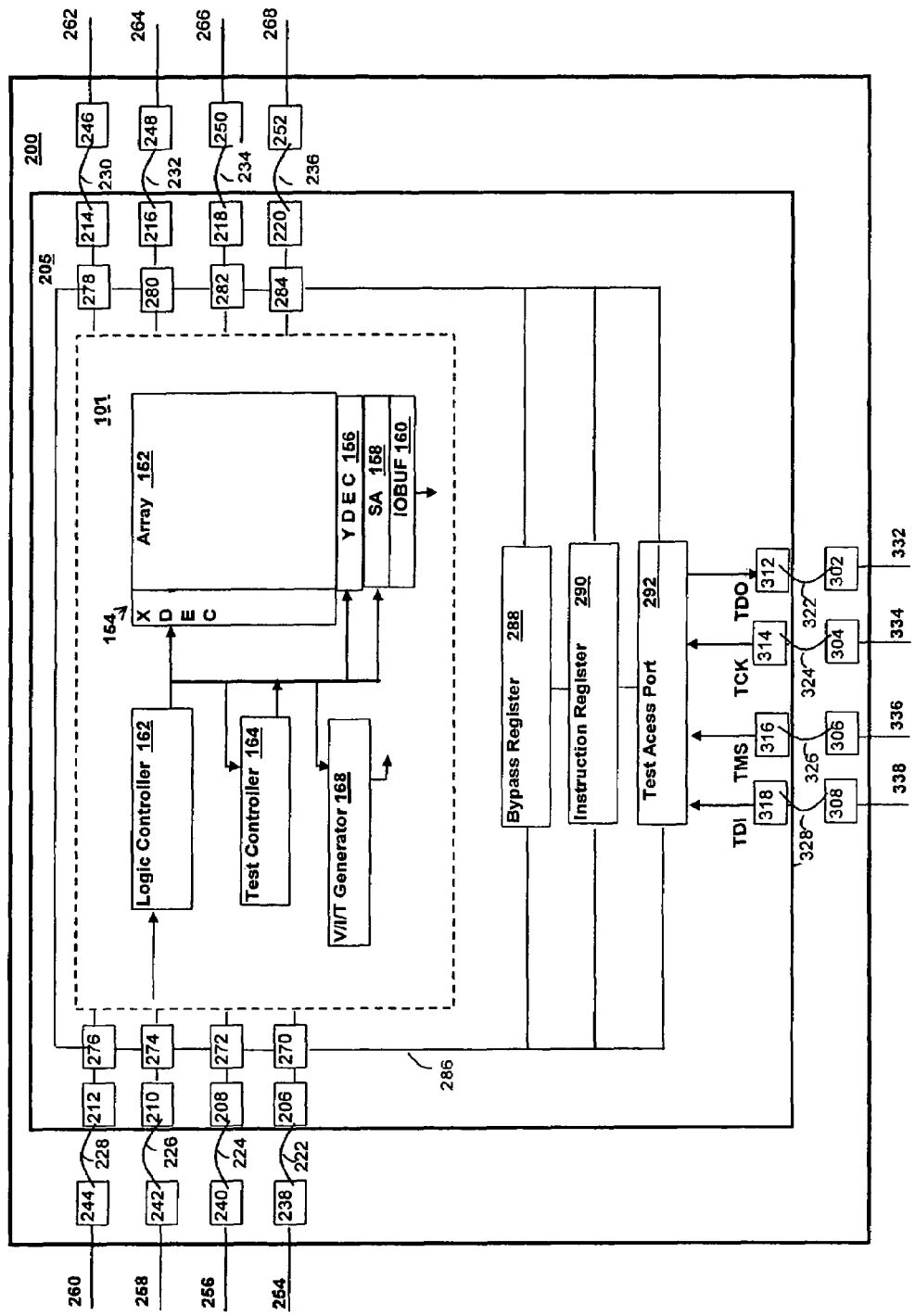
FIGS. 3A-3B illustrate chip-level and system-level block diagrams, respectively, of a flash memory system configured for JTAG-compliant connectivity testing.

FIG. 3A illustrates an exemplary IC configured for testing according to the invention. Similar to conventional packaged ICs, the chip 200 includes a flash memory system 205 in electrical communication with bond pads 206-220, which are connected by bond wires 222-236 to lead frame pads 238-252. 8 bond pads, 8 bond wires, and 8 lead frame pads are shown but other numbers are possible. Also power pads (VDD,GND) are not shown. The pads 238-252 are in turn electrically connected to pins 254-268. The aforementioned components of flash chip 200, and their interconnections, are known in the art. However, the flash chip 200 also includes additional components such as boundary scan cells (BSCs) 270-284 that are electrically connected to both the flash memory system 101 and respective bond pads 206-220. The BSCs 270-284 are serially interconnected along a common data line 286, which is also connected to a bypass register 288, an instruction register 290, and a test access port (TAP) 292. The TAP 292 is, in turn, connected to a test data in (TDI) pin, a test data out (TDO) pin, a test mode select (TMS) pin, and a test clock (TCK) pin. In embodiments of the invention, the structure and function of the BSCs 270-284, registers 288-290, and pins TDI, TDO, TMS, and TCK can conform to the IEEE Standard 1149.1, also commonly known as the JTAG standard. In particular, the BSCs 270-284 are configured to shift data in serial fashion to each other along the data line 286. In known fashion, the flash memory array 101, BSCs 270-284, and contacts 206-220 can all be fabricated upon a single substrate. However, the invention includes embodiments in which this is not the case.

In operation, test data can be loaded onto the boundary scan cells 270-284 by either the pins 254-268, or by the TDI pin. In one embodiment, the test data operation is as done by the connectivity test as described above. Test data loaded via the pins 254-268 travels across the corresponding bond pads 238-252 and bond wires 222-236 to be stored in the boundary scan cells 270-284. The resulting data is then serially shifted via the data line 286 to the TDO pin for detection and analysis. If one or more of the bond wires 222-236 are incorrectly placed, resulting in an open or a short, the boundary scan cells 270-284 corresponding to the open or shorted wire bonds will store invalid or incorrect data. The invalid/incorrect data is then shifted out to the TDO pin, where the corresponding faulty pins 254-268 can be identified. In contrast, test data loaded via the TDI pin is transmitted along the data line 286 to be serially shifted through the boundary scan cells 270-284 and, if desired, into the memory system 205.

Figure 3B:
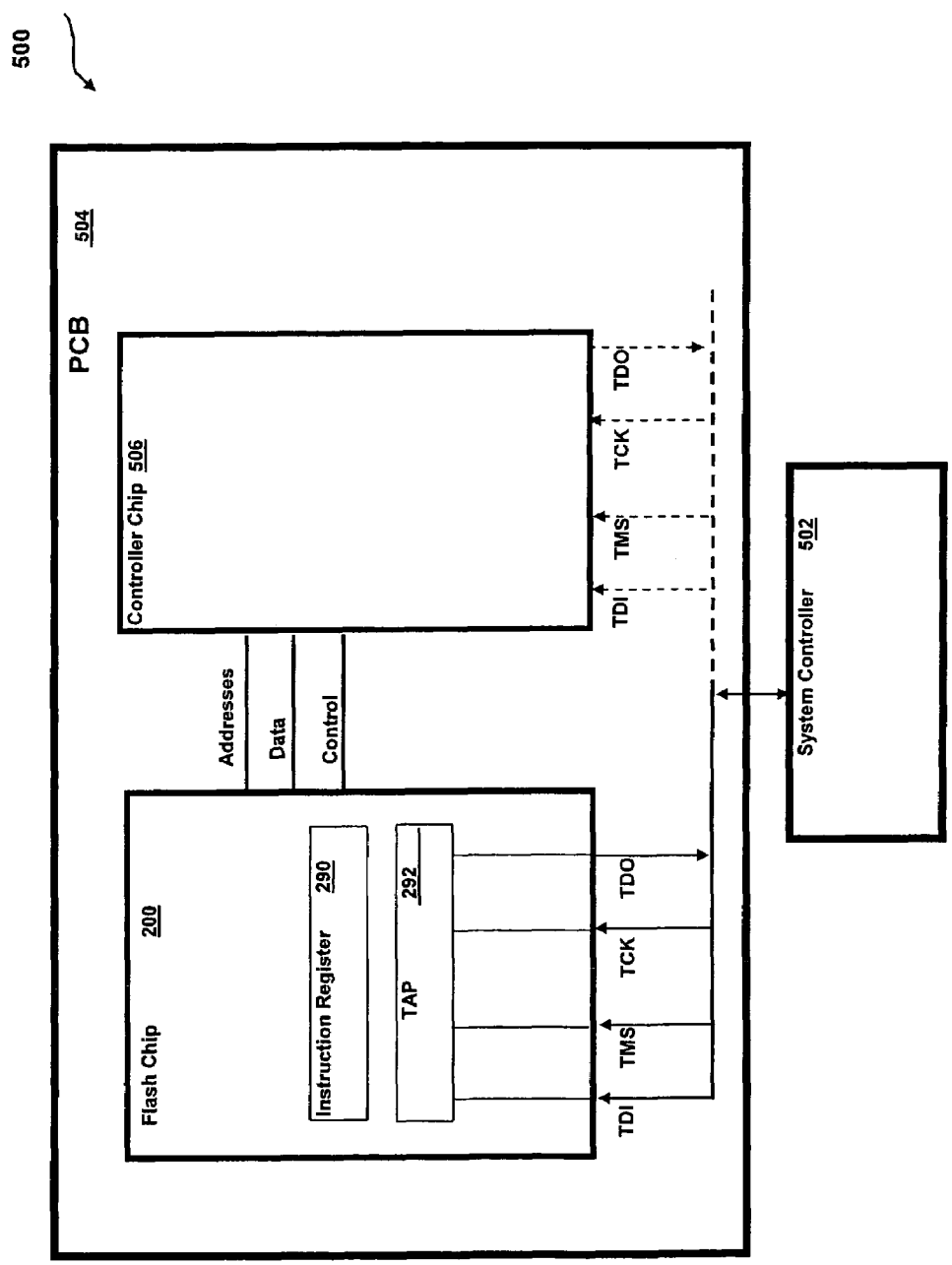

FIG. 3B illustrates a block diagram of a system configured to test the connectivity of chip 200 or the connectivity of chip 506. In the test system 500, connectivity testing is controlled by a controller 502 in communication with a testing board 504 such as a printed circuit board (PCB) upon which the chip 200 can be mounted for testing. The PCB may include a non JTAG-equipped chip 506. The flash chip 200 acts as an interface between the controller 502 and the device 506, and can be any interface configured for facilitating the testing of device 506 by the controller 502 The PCB may also include a JTAG-compliant device 506 which has a TAP (not shown) similar to the TAP 292, as well as a boundary scan register (not shown) for storing test data to be loaded into the BSCs 270-284, and an instruction register (not shown) similar to instruction register 290. The device 506 acts as an interface between the controller 502 and the chip 200, and can be any interface compatible with the testing of chip 200 by the controller 502. One of ordinary skill in the art will realize that the device 506 need not be limited to JTAG-compliant devices. Rather, the invention encompasses the use of any device or method for transmitting test data and control signals to a chip 200, and receiving/analyzing the results.

In operation, flash chip 200 is mounted on the PCB 504, and the controller 502 initiates connectivity testing by transmitting the appropriate instructions and test data (such as described above in connection with Table 1 and FIGS. 2A-2C) to its TAP. The device 506 then transmits instructions to the TMS pin of chip 200 to switch to connectivity test mode, and transmits the test data to either the TDI pin of chip 200 or to its pins 254-268. This transmitted test data is then sent through the pins 254-268 to the bond pads 238-252, then across the bond wires 222-236 and into the BSCs 270-284 where the resulting data is stored. Alternately, test data sent to the TDI pin can be shifted directly into the BSCs 270-284 from the TAP 292. Once the resulting data is serially shifted out to the TDO pin of chip 200, it is returned to the device 506 and on to the controller 502 for analysis.

Figure 3C:
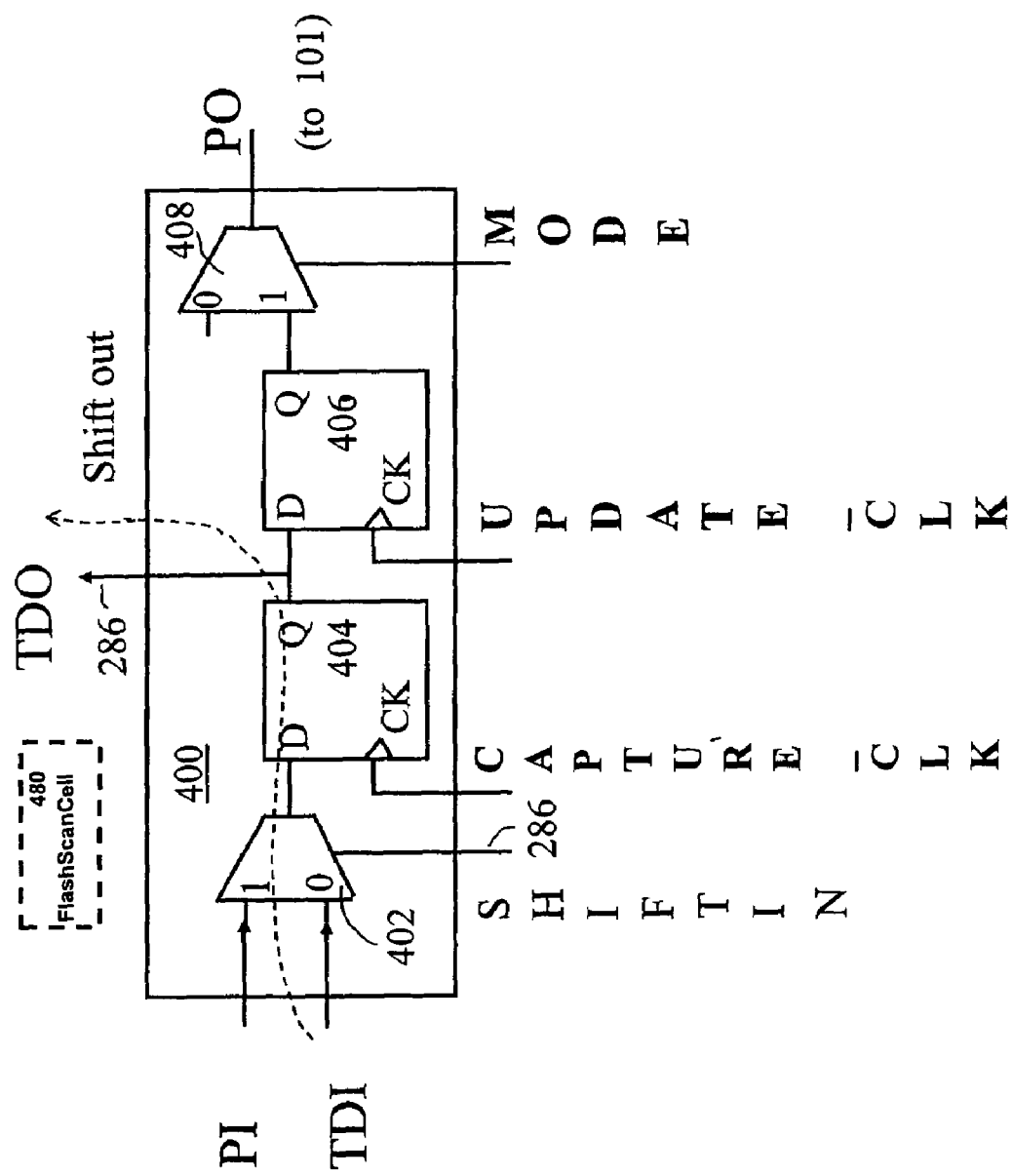
FIG. 3C illustrates an exemplary boundary scan cell (BSC) for use with the system of FIGS. 3A-3B.

Attention now turns to a more detailed description of the BSCs 270-284. FIG. 3C illustrates an exemplary BSC 400 (which is simply a more detailed illustration of BSCs 270-284) having a first multiplexer 402, capture register 404, update register 406, and second multiplexer 408. The first multiplexer 402 receives and multiplexes test data from either the associated pin 254-268, the TDI pin, and data shifted out of the previous BSC. The data is then captured in the capture register 404. When the captured data is data that has already been transmitted through a pin 254-268 and represents information as to the connectivity of that particular pin, the data is serially shifted through the capture registers 404 of the BSCs along the data line 286, for eventual placement on the TDO pin. When the captured data is data that is meant to be sent to the flash memory 101 it is sent to the update register 406 for eventual latching to the memory 101 by the second multiplexer 408. A FlashScanCell 480 is shown that will be discussed below.

The invention encompasses multiple methods of employing the devices of FIGS. 2-3 to test the connectivity of chips 200. In one method, the device 506 is configured to select groups of pins 254-268, and to transmit patterns of test data designed to readily identify connectivity problems. One example of this method is the walking '1' pattern described above, where a group of pins is first selected, and a binary 1 is sent to one of the pins, while binary 0s are sent to the remainder of the pins in the group. If the group of pins is electrically well-connected, the group's BSCs will store the exact same pattern: all 0s except for one 1. Conversely, a connectivity error will result in a differing pattern. More specifically, a short is known to often result in a binary 0 being stored in the BSC instead of a 1, whereas an open will often result in a binary 1 being stored in the BSC instead of a 0. One of ordinary skill in the art will realize that, by successively sending a binary 1 to each pin and binary 0s to the other pins, each pin in the group can be analyzed for connectivity. In this manner, every pin in the group can be analyzed for connectivity in the time it takes to simply send one set of data for each pin, and shift the results out of the BSCs to the TDO pin. Accordingly, embodiments of the invention allow for rapid connectivity testing of the entire chip 200.

The chips of FIGS. 2D-2E can be employed as examples. Here, the chips 200 can be configured for connectivity testing, with no change to their external configurations. More specifically, non-connect (NC) pins can be used as the TDI, TMS, TCK, and TDO pins. The chip 200 is a chip having a flash memory array, and as such has pinouts A0-A19 for providing memory addresses. The chip 200 also has pinouts DQ0-DQ15 for providing data to be stored at/retrieved from the memory addresses, and various control pins for controlling various functions of the chip 200. For example, chip 200 has a CE# pin for receiving a chip enable signal, an OE# pin for receiving output enable signals, and a WE# signal for receiving a write enable signal.

In one testing method, a group of pinouts can be selected, say A0-A7 (it is often convenient, but not necessary to the invention, to select a group of eight pins, so that complete bytes of data can be transmitted). As above, successive bytes of data are then sent to this group of address pins. More specifically, each byte includes all 0s except for a single binary 1, and each byte has its binary 1 in a different position. For example, the first byte sent to pins A0-A7 can be 10000000 so that a binary 1 is sent to pin A0 while binary 0s are sent to the remaining pins A1-A7. If the connectivity of each pin is adequate, the BSCs connected to each pin A0-A7 should then wind up collectively storing the same "result byte," 10000000. In contrast, a short at pin A0 or an open in any other pin will result in a different byte being stored. For instance, in this situation, a short at pin A0 will lead to a result byte of 00000000, and an open at any other pin, say pin A5, will lead to a result byte of 10001000. The result byte is then serially shifted to the TDO pin for analysis, where the controller 302 can be programmed to analyze the result byte as above, and report any connectivity error that is detected.

The next byte sent to pins A0-A7 can then be "01000000" so that a binary 1 is sent to pin A1, while binary 0s are sent to pin A0 and pins A2-A7. As above, a short at pin A1 or an open in any other pin will result in a different byte being stored. Namely, a short at A1 will result in 00000000 being stored, while an open at another pin such as A7 will lead to a result byte of 01000001. In this manner, one of ordinary skill in the art will realize that the transmission of successive bytes to the selected pins, each having a binary 1 in a different position and otherwise containing all binary 0s, will allow the system of the invention to determine the existence and location of any short or open in any of the selected pins. In addition, this determination is accomplished by sending only a single byte for each pin to be analyzed, allowing connectivity to be rapidly and accurately tested. By repeating the process for different groups of address pins, the entirety of the address pins can be quickly tested.

In another testing method, a pattern of test data can be sent to all pins including address pins, data pins and control pins through the BSCs, at which point connectivity testing is performed by asserting the input pattern data to each of the pins simultaneously, reading back the data from the pins, and comparing the resulting data to the input pattern data. The result is then transmitted through the BSC to an on-chip controller (such as test controller 164) or an external controller (such as system controller 502).

Other testing methods can test the connectivity of the flash memory 205 itself, rather than just its connections to pins 254-268. Recall that the BSCs 270-284 can transmit test result data to two different destinations: the subsequent BSC in the serial chain, and the flash memory 205. This method takes advantage of the latter. More specifically, test data transmitted to the TDI pin is shifted into the capture registers 404 of the BSCs 270-284 via the data line 286, where it is sent to the update registers 406 and latched onto the memory 205. The test data is then stored in specified cells of the memory 205, where it can be retrieved and stored in another BSC farther along in the serial chain. For example, a four-bit test data pattern such as 1000 can be transmitted via the TDI pin and serially shifted into BSCs 270-276, where it is then latched onto the flash memory 205. The BSCs 278-284 can then retrieve the resulting data for shifting to the TDO pin. If the resulting data is identical, i.e. if the BSCs 278-284 retrieve and store a 1000, and if the subsequent test data (i.e. 0100, 0010, 0001) also yields good results, that portion of the flash memory 205 can be deemed free of connectivity errors. Conversely, result data (or data retrieved by the BSCs 278-284 after the test data is stored) that differs from the test data indicates a connectivity error within the array of the flash memory 205. It can thus be seen that the methods of the invention can be employed to detect and locate connectivity errors in both a memory array and its pinouts. The process can then be repeated as necessary at different portions of the flash memory 205.

In order to further facilitate connectivity analysis of the flash memory 205, the BSCs 270-284 can be further configured to analyze the result data retrieved from the flash memory 205. This can be accomplished by fabricating a scanning element 480 within each BSC 270-284. This scanning element 480 can be a digital comparator connected to the capture register 404 and/or the update register 406, and configured to test whether a digital 1 or 0 is received by either register. The scanning element can also be a comparator in communication with the memory array 101 and configured to determine the contents of memory cells by comparing voltage levels from the memory cells to a reference voltage level. The outputs of such comparison operations can then be serially shifted to the TDO pin and output from the chip 200. In this manner, the BSCs 270-284 allow for connectivity to be determined on the chip 200 itself.

One of ordinary skill in the art will realize that the invention is not limited solely to the methods described above, but rather encompasses many different embodiments that allow for rapid connectivity testing by merely transmitting a single set of data per pin analyzed (e.g., 8 pins can be fully analyzed by 8 bytes of data). For example, the invention is not limited to the connectivity analysis of address pins and data pins. Instead, other types of pins, such as control pins, can be analyzed. In this case, instead of selecting a group of address pins, the controller 302 can select a group of control pins such as pins CE#, OE#, and WE#, and transmit successive control information to these pins. For instance, a 001, 010, and 100 can be successively transmitted to the CE#, OE#, and WE# pins so as to determine the connectivity of each pin. After each set of control information (i.e., each three-bit set of control information 001, 010, etc.) is transmitted to the control pins and the corresponding results are stored in the BSCs of these pins, the results are serially shifted along data line 286 to the TDO pin for analysis by the controller 302.

FIG. 4A describes a method of testing flash memory consistent with aspects of the innovations herein. The method involves selecting address pins from a set of address pins 410, transmitting address information to the set of address pins 420, retrieving the transmitted address information from the set of address pins 430, and comparing the transmitted address information to the retrieved transmitted address information 440, so as to determine an electrical connectivity between the set of address pins and the flash memory array.

FIG. 4B describes another implementation of a method of testing flash memory consistent with aspects of the innovations herein. This method may be performed in connection with the method described in FIG. 4A, along with additionally transmitting data to the data pins for storage in the flash memory array according to the address information 450, retrieving stored data corresponding to the transmitted data from the data pins 460, and comparing the transmitted data to the stored data so as to determine an electrical connectivity between the data pins and the flash memory array 470.

FIG. 4C describes another implementation of a method of testing flash memory consistent with aspects of the innovations herein. This method may be performed in connection with the method described in FIG. 4B, along with additionally selecting from the address pins successive sets of address pins 480 and repeating the transmitting, retrieving, and comparing with the successive sets of address pins in place of the set of address pins 490.

FIG. 5A describes a method of testing flash memory consistent with aspects of the innovations herein. The method may include selecting from the control pins a set of control pins 510, transmitting control information to the set of control pins 520, retrieving the transmitted control information from the set of control pins 530 and comparing the transmitted control information to the retrieved transmitted control information 540, so as to determine an electrical connectivity between the set of control pins and the flash memory array.

FIG. 5B describes another implementation of a method of testing flash memory consistent with aspects of the innovations herein. This method may be performed in connection with the method described in FIG. 5A, along with additionally selecting from the control pins successive sets of control pins 550 and repeating the transmitting, retrieving, and comparing with the successive sets of control pins in place of the set of control pins 560.

One of ordinary skill in the art will also realize that the invention is not limited to any particular flash memory array 204. Indeed, those of skill in the art will realize that the methods of the invention can be employed with any flash memory array to which BSCs and other such appropriate devices can be electrically connected, including those arrays employing source side injection flash memory cells, and multilevel memory cells.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed. Many modifications and variations are possible in view of the above teachings. For example, the methods and apparatuses of the invention can be utilized to analyze the connectivity of various chips, including any type of flash memory array. Similarly, any pin on the chip can be analyzed, including address pins, data pins, and control pins. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A method of testing a flash memory integrated circuit having a flash memory array, address pins for specifying addresses of the flash memory array, and data pins for transferring data to be stored at the addresses of the flash memory array, the method comprising:
   selecting from the address pins a set of address pins;
   transmitting a transmitted set of address information to the set of address pins;
   retrieving, via a path through the flash memory array, a retrieved set of address information from the set of address pins wherein the retrieved set of address information is the transmitted set of address information as transformed by the path through the flash memory array; and
   comparing the transmitted set of address information to the retrieved set of address information, so as to determine an electrical connectivity between the set of address pins and the flash memory array.

2. The method of claim 1:
   wherein the transmitting address information further comprises successively transmitting the transmitted set of address information to each pin of the set of address pins; and
   wherein the comparing further comprises, for each pin of the set of address pins, successively comparing the transmitted set of address information to the retrieved set of address information retrieved from each pin.

3. The method of claim 2:
   wherein the transmitting address information further comprises, for each pin of the set of address pins, transmitting a binary 1 to the each pin and transmitting a binary 0 to each other pin of the set of address pins as the transmitted set of address information;
   wherein the retrieving further comprises, for each transmitted binary 1 and associated binary 0s, retrieving corresponding binary address information as the retrieved set of address information from the set of address pins; and
   wherein the comparing further comprises, for each pin of the set of address pins, comparing the transmitted binary 1 and associated binary 0s to the retrieved binary address information.

4. The method of claim 1 further comprising:
   transmitting data to the data pins for storage in the flash memory array according to the address information;
   retrieving as the retrieved set of address information, stored data corresponding to the transmitted set of data, from the data pins; and
   comparing the transmitted data to the stored data so as to determine an electrical connectivity between the data pins and the flash memory array.

5. The method of claim 4:
   wherein the transmitting data further comprises successively transmitting data to each pin of the data pins;
   wherein the retrieving further comprises successively retrieving the stored data corresponding to the successively transmitted data; and
   wherein the comparing the transmitted data further comprises, for each pin of the data pins, comparing the successively transmitted data to the successively retrieved data.

6. The method of claim 5:
   wherein the transmitting data further comprises, for each pin of the data pins, transmitting a binary 1 to the each pin and transmitting a binary 0 to each other pin of the data pins:
   wherein the retrieving further comprises, for each transmitted binary 1 and associated binary 0s, retrieving corresponding binary data; and
   wherein the comparing further comprises, for each pin of the data pins, comparing the transmitted binary 1 and associated binary 0s to the retrieved binary data.

7. The method of claim 1 further comprising:
   selecting from the address pins successive sets of address pins; and
   repeating the transmitting, retrieving, and comparing with the successive sets of address pins in place of the set of address pins.

8. A method of testing a flash memory integrated circuit having a flash memory array and control pins for receiving control signals, the method comprising:
   selecting from the control pins a set of control pins;
   transmitting a transmitted set of control information to the set of control pins;
   retrieving, via a path through the flash memory array, a retrieved set of control information from the set of control pins, wherein the retrieved set of control information is the transmitted set of address information as transformed by the path through the flash memory array; and
   comparing the transmitted control information to the retrieved set of control information, so as to determine an electrical connectivity between the set of control pins and the flash memory array.

9. The method of claim 8:
   wherein the transmitting control information further comprises successively transmitting the transmitted set of control information to each pin of the set of control pins; and
   wherein the comparing further comprises, for each pin of the set of control pins, comparing the successively transmitted control information to control information retrieved from the each pin.

10. The method of claim 9:

wherein the transmitting control information further comprises, for each pin of the set of control pins, transmitting a binary 1 to the each pin and transmitting a binary 0 to each other pin of the set of control pins;

wherein the retrieving further comprises, for each transmitted binary 1 and associated binary 0s, retrieving corresponding binary control information from the set of control pins; and wherein the comparing further comprises, for each pin of the set of control pins, comparing the transmitted binary 1 and associated binary 0s to the retrieved binary control information.

11. The method of claim 8 further comprising:

selecting from the control pins successive sets of control pins; and repeating the transmitting, retrieving, and comparing with the successive sets of control pins in place of the set of control pins.

12. A device for testing a flash memory integrated circuit having a flash memory array, address pins for specifying addresses of the flash memory array, and data pins for transferring data to be stored at the addresses of the flash memory array, the device comprising:

a controller; and an interface configured to place the controller in electronic communication with the address pins and the data pins of the flash memory circuit;

wherein the controller is configured to select a set of the address pins, to transmit a transmitted set of address information to the selected set of address pins, to retrieve a retrieved version of the transmitted set of address information from the set of address pins via an electrical path through the flash memory array, and to compare the transmitted address information to the retrieved version of the transmitted set of address information, so as to determine an electrical connectivity between the set of address pins and the flash memory array.

13. The device of claim 12 wherein the controller is further configured to transmit the transmitted set of address information by successively transmitting address information to each pin of the set of address pins, and to compare by, for each pin of the set of address pins, comparing the successively transmitted set of address information to the retrieved version of the transmitted set of address information retrieved from the each pin.

14. The device of claim 13 wherein the controller is further configured to:

successively transmit address information by, for each pin of the set of address pins, transmitting a binary 1 to the each pin and transmitting a binary 0 to each other pin of the set of address pins;

retrieve by, for each transmitted binary 1 and associated binary 0s, retrieving corresponding binary address information from the set of address pins; and compare by, for each pin of the set of address pins, comparing the transmitted binary 1 and associated binary 0s to the retrieved binary address information.

15. The device of claim 12 wherein the controller is further configured to:

transmit data to the data pins for storage in the flash memory array according to the address information;

retrieve stored data corresponding to the retrieved version of the transmitted data from the data pins; and compare the transmitted data to the stored data so as to determine an electrical connectivity between the data pins and the flash memory array.

16. The device of claim 15 wherein the controller is further configured to:

transmit data to the data pins by successively transmitting data to each pin of the data pins;

retrieve stored data by successively retrieving the stored data corresponding to the successively transmitted data; and compare the transmitted data by, for each pin of the data pins, comparing the successively transmitted data to the successively retrieved data.

17. The device of claim 16 wherein the controller is further configured to:

successively transmit data by, for each pin of the data pins, transmitting a binary 1 to the each pin and transmitting a binary 0 to each other pin of the data pins:

retrieve the transmitted data by, for each transmitted binary 1 and associated binary 0s, retrieving corresponding binary data; and compare the transmitted data by, for each pin of the data pins, comparing the transmitted binary 1 and associated binary 0s to the retrieved binary data.

18. The device of claim 12 wherein the controller is further configured to:

select from the address pins successive sets of address pins; and repeat the transmitting, retrieving, and comparing with the successive sets of address pins in place of the set of address pins.

* * * * *